(12) United States Patent
Li (10) Patent No.: US 9,666,653 B2
(45) Date of Patent: May 30, 2017

(54) METHOD FOR MANUFACTURING TFT SUBSTRATE AND STRUCTURE THEREOF

(71) Applicant: Shenzhen China Star Optoelectronics Technology Co., Ltd., Shenzhen (CN)

(72) Inventor: Wenhui Li, Shenzhen (CN)

(73) Assignee: SHENZHEN CHINA STAR OPTOELECTRONICS TECHNOLOGY CO., LTD., Shenzhen, Guangdong (CN)

(*) Notice: Subject to any disclaimer, the term of this patent is extended or adjusted under 35 U.S.C. 154(b) by 48 days.

(21) Appl. No.: 14/786,158

(22) PCT Filed: May 20, 2015

(86) PCT No.: PCT/CN2015/079376
§ 371 (c)(1),
(2) Date: Oct. 21, 2015

(87) PCT Pub. No.: WO2016/173011
PCT Pub. Date: Nov. 3, 2016

(65) Prior Publication Data
US 2017/0110527 A1    Apr. 20, 2017

(30) Foreign Application Priority Data
Apr. 29, 2015 (CN) .......................... 2015 1 0213939

(51) Int. Cl.
*H01L 27/32* (2006.01)
*H01L 27/12* (2006.01)
*H01L 21/77* (2017.01)

(52) U.S. Cl.
CPC ........ *H01L 27/3262* (2013.01); *H01L 27/124* (2013.01); *H01L 27/1262* (2013.01); *H01L 27/1288* (2013.01); *H01L 27/3246* (2013.01); *H01L 27/3276* (2013.01); *H01L 2021/775* (2013.01); *H01L 2227/323* (2013.01)

(58) Field of Classification Search
None
See application file for complete search history.

(56) References Cited

U.S. PATENT DOCUMENTS

| 2005/0263757 A1* | 12/2005 | Lee ..................... H01L 27/3211 257/40 |
| 2014/0159010 A1* | 6/2014 | Song ................... H01L 27/3276 257/40 |
| 2015/0214373 A1* | 7/2015 | Zhang ................. H01L 29/7869 257/72 |

* cited by examiner

Primary Examiner — Michelle Mandala
(74) Attorney, Agent, or Firm — Leong C. Lei (57) ABSTRACT

The present invention provides a method for manufacturing a TFT substrate and a structure thereof. The method for manufacturing a TFT substrate uses a gray tone mask to apply a single photolithographic process to simultaneously manufacture a gate insulation layer, a semiconductor layer, and a etch stop so as to reduce the number of the photolithographic processes used from ten processes to eight processes and reduce the number of masks used thereby simplifying the manufacturing process and effectively increasing the manufacturing efficiency and the yield rate. The TFT substrate structure of the present invention includes a gate insulation layer, a semiconductor layer, and an etch stop layer that are manufactured at the same time with a photolithographic process by using a gray tone mask so that the structure is simple, the manufacturing is easy, and the manufacturing efficiency and yield rate are effectively increased.

5 Claims, 7 Drawing Sheets

Fig. 16

METHOD FOR MANUFACTURING TFT SUBSTRATE AND STRUCTURE THEREOF

BACKGROUND OF THE INVENTION

1. Field of the Invention

The present invention relates to the field of display technology, and in particular to a method for manufacturing a thin-film transistor (TFT) substrate and a structure thereof.

2. The Related Arts

OLED (Organic Light Emitting Diode) has various advantages, such as being self-luminous, high brightness, wide view angle, flexibility, and low power consumption, and is thus attracting wide attention and, as a new generation of display measure, is gradually taking the place of the traditional liquid crystal display to be used in mobile phone screens, computer monitors, and full-color televisions. Based on the way of driving, OLEDs can be classified as passive matrix OLEDs (PMOLEDs) and active matrix OLEDs (AMOLEDs). The AMOLEDs are often involved with an oxide semiconductor backboard, of which the structure is simpler than a low-temperature poly-silicon (LTPS) backboard.

Figure 1:
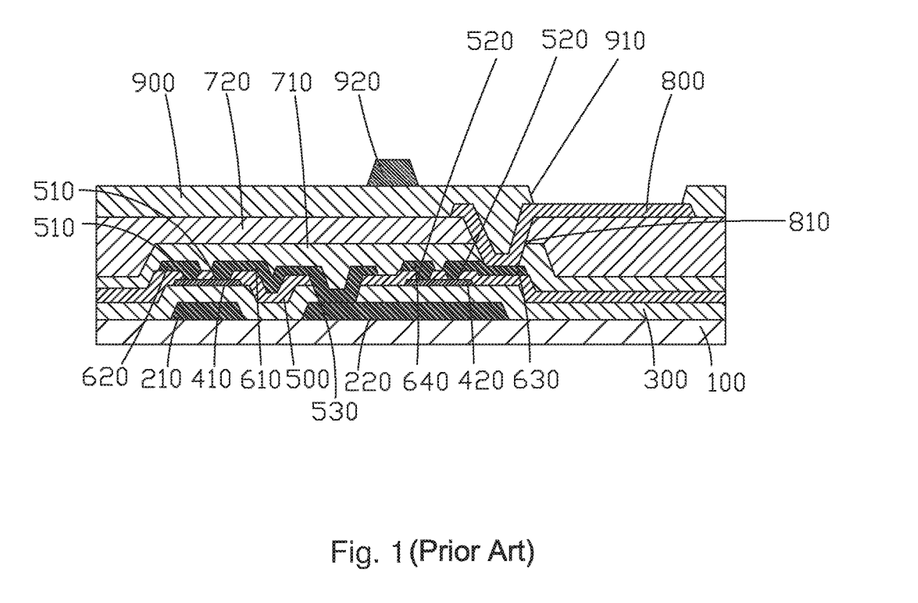
FIG. 1 is a cross-sectional view showing a conventional thin-film transistor (TFT) substrate structure used for active matrix organic light emitting diode (AMOLED)

Referring to FIG. 1, a cross-sectional view is given to illustrate a conventional thin-film transistor (TFT) substrate structure used for active matrix organic light emitting diode (AMOLED), which comprises a base plate 100, a first gate electrode 210 and a second gate electrode 220 formed on the base plate 100, a gate insulation layer 300 formed on the first gate electrode 210, the second gate electrode 220, and the base plate 100, a first semiconductor layer 410 formed on the gate insulation layer 300 and located above the first gate electrode 210, a second semiconductor layer 420 formed on the gate insulation layer 300 and located above the second gate electrode 220, an etch stop layer 500 formed on the first semiconductor layer 410, the second semiconductor layer 420, and the gate insulation layer 300, a first source electrode 610 and a first drain electrode 620 formed on the etch stop layer 500 and located above the first gate electrode 210, a second source electrode 630 and a second drain electrode 640 formed on the etch stop layer 500 and located above the second gate electrode 220, a passivation layer 710 formed on the first source electrode 610, the first drain electrode 620, the second source electrode 630, the second drain electrode 640, and the etch stop layer 500, a planarization layer 720 formed on the passivation layer 710, a pixel electrode layer 800 formed on the planarization layer 720, a pixel definition layer 900 formed on the pixel electrode layer 800 and the planarization layer 720, and photo spacers 920 formed on the pixel definition layer 900.

The etch stop layer 500 comprises two first vias 510 formed therein to correspond to the first semiconductor layer 410 and the etch stop layer 500 comprises two second vias 510 formed therein to correspond to the second semiconductor layer 420. The etch stop layer 500 and the gate insulation layer 300 comprise a third via 530 formed therein to correspond to a side portion of the second gate electrode 220 that is adjacent to the first gate electrode 210. The passivation layer 710 and the planarization layer 720 comprise a fourth via 810 formed therein to correspond to the second source electrode 630. The pixel definition layer 900 comprises a fifth via 910 formed therein to correspond to the pixel electrode layer 800.

The first source electrode 610 and the first drain electrode 620 are connected through the first vias 510 with the first semiconductor layer 410. The second source electrode 630 and the second drain electrode 640 are connected through the second vias 520 with the second semiconductor layer 420. The first source electrode 610 is connected through the third via 530 with the second gate electrode 220. The pixel electrode layer 800 is connected through the fourth via 810 with the second source electrode 630. The fifth via 910 exposes a portion of the pixel electrode layer 800.

Each layer of the first gate electrode 210 and the second gate electrode 220, the gate insulation layer 300, the first semiconductor layer 410 and the second semiconductor layer 420, the etch stop layer 500, the first source electrode 610, the first drain electrode 620, the second source electrode 630, and the second drain electrode 640, the passivation layer 710, the planarization layer 720, the pixel electrode layer 800, the pixel definition layer 900, the photo spacers 920 is manufactured with one photolithographic process. In other words, the TFT substrate shown in FIG. 1 needs ten photolithographic processes in total. The manufacturing process is complicated and the manufacturing efficiency and yield rate may be affected.

SUMMARY OF THE INVENTION

An object of the present invention is to provide a method for manufacturing a thin-film transistor (TFT) substrate, which involves a simple process and can effectively increase manufacturing efficiency and yield rate.

The object of the present invention is also to provide a TFT substrate structure, which has a simple structure, is easy to manufacture, and can effectively increase manufacturing efficiency and yield rate.

To achieve the above objects, the present invention provides a method for manufacturing a TFT substrate, which comprises the following steps:

(1) providing a base plate, wherein the base plate is provided thereon with a TFT zone and a non-TFT zone, depositing a first metal layer on the base plate and applying a first photolithographic process to pattern the first metal layer so as to form a first gate electrode and a second gate electrode that are spaced from each other;

(2) sequentially depositing a gate insulation layer, a semiconductor layer, and an etch stop layer on the first gate electrode, the second gate electrode, and the base plate;

(3) applying a second photolithographic process to subject the gate insulation layer, the semiconductor layer, and the etch stop layer to patterning treatment so as to form, in the etch stop layer, a first contact hole and a second contact hole that correspond to and are located above the first gate electrode and a third contact hole and a fourth contact hole that correspond to and are located above the second gate electrode, and to form a fifth contact hole in the etch stop layer, the semiconductor layer, and the gate insulation layer to correspond to and be located above a side portion of the second gate electrode that is adjacent to the first gate electrode, wherein the first contact hole, the second contact hole, the third contact hole, the fourth contact hole, and the fifth contact hole are all through holes;

(4) depositing a second metal layer on the etch stop layer and applying a third photolithographic process to pattern the second metal layer so as to form a first source electrode, a first drain electrode, a second source electrode, and a second drain electrode that are spaced from each other, the first source electrode, the first drain electrode, the second source electrode, and the second drain electrode being respectively connected through the first contact hole, the second contact hole, the third contact hole, the fourth contact hole with the semiconductor layer, wherein the first gate electrode, the semiconductor layer, the first source electrode, and the first drain electrode collectively constitute a first TFT; the second gate electrode, the semiconductor layer, the second source electrode, and the second drain electrode collectively constitute a second TFT; and the first drain electrode is connected through the fifth contact hole with the second gate electrode so as to have the first TFT and the second TFT connected in series;

(5) depositing a passivation layer on the first source electrode, the first drain electrode, the second source electrode, the second drain electrode, the etch stop layer, and the base plate and applying a fourth photolithographic process to subject the passivation layer to patterning so as to form a sixth through hole in the passivation layer to correspond to and be located above the second drain electrode;

(6) depositing a planarization layer on the passivation layer and applying a fifth photolithographic process to subject the planarization layer to patterning so as to form a seventh through hole in the planarization layer to correspond to the sixth through hole;

(7) depositing a pixel electrode layer on the planarization layer and applying a sixth photolithographic process to conduct patterning thereon, the pixel electrode layer being connected through the sixth through hole and the seventh through hole with the second drain electrode;

(8) depositing a pixel definition layer on the pixel electrode layer and the planarization layer and applying a seventh photolithographic process to conduct patterning thereon so as to form an eighth through hole in the pixel definition layer to correspond to the pixel electrode layer thereby exposing a portion of the pixel electrode layer; and (9) depositing an organic photoresist layer on the pixel definition layer and applying an eighth photolithographic process to conduct patterning thereon so as to form a plurality of photo spacers that is spaced from each other.

Step (3) comprises the following steps:

(31) depositing a photoresist layer on the etch stop layer and using a gray tone mask to subject the photoresist layer to exposure and development so as to completely etch off a portion of the photoresist layer that corresponds to the non-TFT zone of the base plate and to form, in the photoresist layer, a first trough and a second trough that are spaced from each other and corresponding to and located above the first gate electrode, a third trough and a fourth trough that are spaced from each other and corresponding to and located above the second gate electrode, and a first through hole that corresponds to and is located above a side portion of the second gate electrode that is adjacent to the first gate electrode;

(32) using the photoresist layer as a shielding layer to subject the etch stop layer to etching by applying a first dry etch process so as to completely etch off a portion of the etch stop layer that corresponds to the non-TFT zone of the base plate and a portion of the etch stop layer that corresponds to the first through hole 65 of the photoresist layer;

(33) applying an ashing process to subject the photoresist layer to ashing treatment so as to reduce the overall thickness of the photoresist layer in such a way that bottoms of the first trough, the second trough, the third trough, and the fourth trough of the photoresist layer are made completely through and respectively forming a second through hole, a third through hole, a fourth through hole, and a fifth through hole;

(34) using the photoresist layer as a shielding layer to subject the semiconductor layer to etching by applying a wet etch process so as to completely etch off a portion of the semiconductor layer that corresponds to the non-TFT zone of the base plate and a portion of the semiconductor layer that corresponds to the first through hole of the photoresist layer;

(35) using the photoresist layer as a shielding layer to subject the etch stop layer and the gate insulation layer to etching by applying a second dry etch process so as to completely etch off portions of the etch stop layer that correspond to the second through hole, the third through hole, the fourth through hole, and the fifth through hole of the photoresist layer to form, in the etch stop layer, the first contact hole and the second contact hole that are corresponding to and located above the first gate electrode and the third contact hole and the fourth contact hole that are corresponding to and located above the second gate electrode, and, also, to completely etch off a portion of the gate insulation layer that corresponds to the non-TFT zone of the base plate and a portion of the gate insulation layer that corresponds to the first through hole of the photoresist layer to form, in the etch stop layer, the semiconductor layer, and the gate insulation layer, the fifth contact hole that corresponds to and is located above the side portion of the second gate electrode that is adjacent to the first gate electrode; and (36) peeling off the photoresist layer.

The gate insulation layer is formed of a material comprising silicon oxide or silicon nitride; the semiconductor layer is formed of a material comprising metal oxide; and the etch stop layer is formed of a material comprising silicon oxide or silicon nitride.

The first dry etch process of step (32) is conducted with the following operation parameters: wherein when the etch stop layer is formed of a material comprising silicon oxide, dry etching is conducted with a $CF_4+O_2$ atmosphere, $CF_4$ flow rate being 0-5000 sccm, $O_2$ flow rate being 0-5000 sccm, etching time being 1-1000 s; and when the etch stop layer (5) is formed of a material comprising silicon nitride, dry etching is conducted with a $SF_6+Cl_2$ atmosphere, $SF_6$ flow rate being 0-5000 sccm, $Cl_2$ flow rate being 0-5000 sccm, etching time being 1-1000 s;

wherein the ashing process of step (33) is conducted with the following operation parameters: ashing of photoresist being conducted with an $O_2$ atmosphere, $O_2$ flow rate being 0-5000 sccm, ashing time being 1-1000 s;

wherein the wet etch process of step (34) is conducted with the following operation parameters: wet etching being conducted with $H_2C_2O_4$ solution, the $H_2C_2O_4$ solution having a concentration of 0.1%-50% mol/L, etching time being 1-1000 s;

wherein the second dry etch process of step (35) is conducted with the following operation parameters: wherein when the etch stop layer and the gate insulation layer are formed of materials comprising silicon oxide, dry etching is conducted with a $CF_4+O_2$ atmosphere, $CF_4$ flow rate being 0-5000 sccm, $O_2$ flow rate being 0-5000 sccm, etching time being 1-1000 s; and when the etch stop layer and the gate insulation layer are formed of materials comprising silicon nitride, dry etching is conducted with a $SF_6+Cl_2$ atmosphere, $SF_6$ flow rate being 0-5000 sccm, $Cl_2$ flow rate being 0-5000 sccm, etching time being 1-1000 s.

The base plate comprises a glass board; the first gate electrode and the second gate electrode are formed of a material comprising copper, aluminum, or molybdenum; and the first source electrode, the first drain electrode, the second source electrode, and the second drain electrode are formed of a material comprising copper, aluminum, or molybdenum.

The present invention also provides a TFT substrate structure, which comprises a base plate, a first gate electrode and a second gate electrode formed on the base plate and spaced from each other, a gate insulation layer formed on the first gate electrode, the second gate electrode, and the base plate, a semiconductor layer formed on the gate insulation layer, an etch stop layer formed on the semiconductor layer, a first source electrode, a first drain electrode, a second source electrode, and a second drain electrode formed on the etch stop layer and spaced from each other, a passivation layer formed on the first source electrode, the first drain electrode, the second source electrode, and the second drain electrode and covering the base plate, a planarization layer formed on the passivation layer, a pixel electrode layer formed on the planarization layer, a pixel definition layer formed on the planarization layer and the pixel electrode layer, and photo spacers formed on the pixel definition layer;

wherein the etch stop layer comprises, formed therein, a first contact hole and a second contact hole corresponding to and located above the first gate electrode and a third contact hole a the fourth contact hole corresponding to and located above the second gate electrode; the etch stop layer, the semiconductor layer, and the gate insulation layer comprise a fifth contact hole formed therein to correspond to and be located above a side portion of the second gate electrode that is adjacent to the first gate electrode; the first contact hole, the second contact hole, the third contact hole, the fourth contact hole, and the fifth contact hole are all through holes;

wherein the first source electrode, the first drain electrode, the second source electrode, and the second drain electrode are respectively connected through the first contact hole, the second contact hole, the third contact hole, the fourth contact hole with the semiconductor layer; the first gate electrode, the semiconductor layer, the first source electrode, and the first drain electrode collectively constitute a first TFT; the second gate electrode, the semiconductor layer, the second source electrode, and the second drain electrode collectively constitute a second TFT; and the first drain electrode is connected through the fifth contact hole with the second gate electrode so as to have the first TFT and the second TFT connected in series; and wherein the passivation layer comprises a sixth through hole formed therein to correspond to and be located above the second drain electrode; the planarization layer comprises a seventh through hole formed therein to correspond to the sixth through hole; the pixel electrode layer is connected through the sixth through hole and the seventh through hole with the second drain electrode; the pixel definition layer comprises an eighth through hole formed therein to correspond to and be located above the pixel electrode layer; and the eighth through hole exposes a portion of the pixel electrode layer.

Tthe gate insulation layer, the semiconductor layer, and the etch stop layer are formed with one photolithographic process.

The first TFT is a switching TFT and the second TFT is a driving TFT.

The base plate comprises a glass board; the first gate electrode and the second gate electrode are each formed of a material comprising copper, aluminum, or molybdenum; the gate insulation layer is formed of a material comprising silicon oxide or silicon nitride; the semiconductor layer is formed of a material comprising metal oxide; and the semiconductor layer is formed of a material comprising metal oxide.

The etch stop layer is formed of a material comprising silicon oxide or silicon nitride; and the first source electrode, the first drain electrode, the second source electrode, and the second drain electrode are each formed of a material comprising copper, aluminum, or molybdenum.

The present invention further provides a TFT substrate structure, which comprises a base plate, a first gate electrode and a second gate electrode formed on the base plate and spaced from each other, a gate insulation layer formed on the first gate electrode, the second gate electrode, and the base plate, a semiconductor layer formed on the gate insulation layer, an etch stop layer formed on the semiconductor layer, a first source electrode, a first drain electrode, a second source electrode, and a second drain electrode formed on the etch stop layer and spaced from each other, a passivation layer formed on the first source electrode, the first drain electrode, the second source electrode, and the second drain electrode and covering the base plate, a planarization layer formed on the passivation layer, a pixel electrode layer formed on the planarization layer, a pixel definition layer formed on the planarization layer and the pixel electrode layer, and photo spacers formed on the pixel definition layer;

wherein the etch stop layer comprises, formed therein, a first contact hole and a second contact hole corresponding to and located above the first gate electrode and a third contact hole a the fourth contact hole corresponding to and located above the second gate electrode; the etch stop layer, the semiconductor layer, and the gate insulation layer comprise a fifth contact hole formed therein to correspond to and be located above a side portion of the second gate electrode that is adjacent to the first gate electrode; the first contact hole, the second contact hole, the third contact hole, the fourth contact hole, and the fifth contact hole are all through holes;

wherein the first source electrode, the first drain electrode, the second source electrode, and the second drain electrode are respectively connected through the first contact hole, the second contact hole, the third contact hole, the fourth contact hole with the semiconductor layer; the first gate electrode, the semiconductor layer, the first source electrode, and the first drain electrode collectively constitute a first TFT; the second gate electrode, the semiconductor layer, the second source electrode, and the second drain electrode collectively constitute a second TFT; and the first drain electrode is connected through the fifth contact hole with the second gate electrode so as to have the first TFT and the second TFT connected in series;

wherein the passivation layer comprises a sixth through hole formed therein to correspond to and be located above the second drain electrode; the planarization layer comprises a seventh through hole formed therein to correspond to the sixth through hole; the pixel electrode layer is connected through the sixth through hole and the seventh through hole with the second drain electrode; the pixel definition layer comprises an eighth through hole formed therein to correspond to and be located above the pixel electrode layer; and the eighth through hole exposes a portion of the pixel electrode layer;

wherein the gate insulation layer, the semiconductor layer, and the etch stop layer are formed with one photolithographic process; and wherein the first TFT is a switching TFT and the second TFT is a driving TFT.

The efficacy of the present invention is that the present invention provides a method for manufacturing a TFT substrate, which uses a gray tone mask to apply a single photolithographic process to simultaneously manufacture a gate insulation layer, a semiconductor layer, and a etch stop so as to reduce the number of the photolithographic processes used from ten processes to eight processes and reduce the number of masks used thereby simplifying the manufacturing process and effectively increasing the manufacturing efficiency and the yield rate. The present invention provides a TFT substrate structure, of which a gate insulation layer, a semiconductor layer, and an etch stop layer are manufactured at the same time with a photolithographic process by using a gray tone mask so that the structure is simple, the manufacturing is easy, and the manufacturing efficiency and yield rate are effectively increased.

For better understanding of the features and technical contents of the present invention, reference will be made to the following detailed description of the present invention and the attached drawings. However, the drawings are provided for the purposes of reference and illustration and are not intended to impose limitations to the present invention.

BRIEF DESCRIPTION OF THE DRAWINGS

The technical solution, as well as other beneficial advantages, of the present invention will become apparent from the following detailed description of an embodiment of the present invention, with reference to the attached drawings.

In the drawings.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Figure 2:
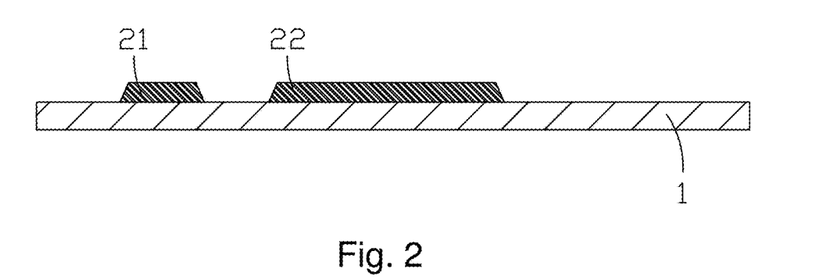
FIG. 2 is a schematic view illustrating step 1 of a method for manufacturing a TFT substrate according to the present invention.

Referring to FIGS. 2-14, the present invention provides a method for manufacturing a thin-film transistor (TFT) substrate, which comprises the following steps:

Step 1: as shown in FIG. 2, providing a base plate 1, wherein the base plate 1 is provided thereon with a TFT zone and a non-TFT zone, depositing a first metal layer on the base plate 1 and applying a first photolithographic process to pattern the first metal layer so as to form a first gate electrode 21 and a second gate electrode 22 that are spaced from each other.

Specifically, the base plate 1 comprises a glass board.

The first gate electrode 21 and the second gate electrode 22 are each formed of a material comprising copper, aluminum, or molybdenum.

Figure 3:
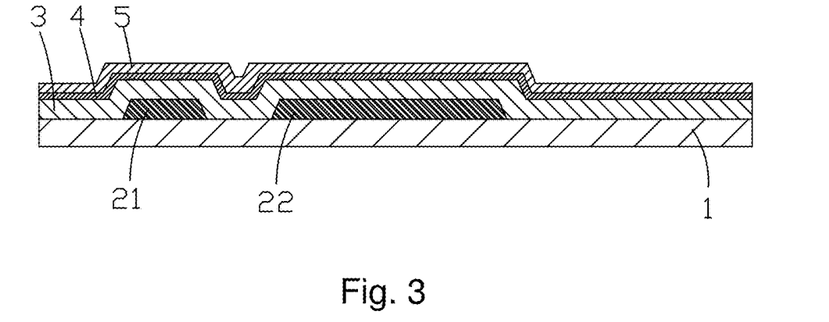
FIG. 3 is a schematic view illustrating step 2 of the method for manufacturing a TFT substrate according to the present invention.

Step 2: as shown in FIG. 3, sequentially depositing a gate insulation layer 3, a semiconductor layer 4, and an etch stop layer 5 on the first gate electrode 21, the second gate electrode 22, and the base plate 1.

Specifically, the gate insulation layer 3 is formed of a material comprising silicon oxide ($SiO_x$) or silicon nitride ($SiN_x$).

The semiconductor layer 4 is formed of a material comprising metal oxide. Preferably, the metal oxide is IGZO (indium gallium zinc oxide) or IZO (indium zinc oxide).

The etch stop layer 5 is formed of a material comprising silicon oxide or silicon nitride.

Step 3: as shown in FIGS. 4-10, applying a second photolithographic process to subject the gate insulation layer 3, the semiconductor layer 4, and the etch stop layer 5 to patterning treatment so as to form, in the etch stop layer 5, a first contact hole 51 and a second contact hole 52 that correspond to and are located above the first gate electrode 21 and a third contact hole 53 and a fourth contact hole 54 that correspond to and are located above the second gate electrode 22, and to form a fifth contact hole 55 in the etch stop layer 5, the semiconductor layer 4, and the gate insulation layer 3 to correspond to and be located above a side portion of the second gate electrode 22 that is adjacent to the first gate electrode 21, wherein the first contact hole 51, the second contact hole 52, the third contact hole 53, the fourth contact hole 54, and the fifth contact hole 55 are all through holes.

Figure 4:
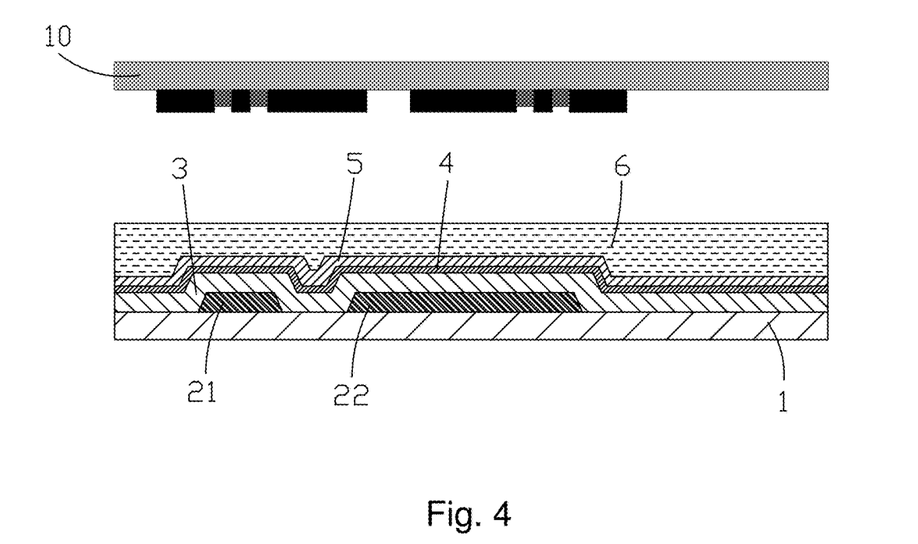
FIGS. 4 and 5 are schematic views illustrating step 31 of the method for manufacturing a TFT substrate according to the present invention.
Figure 5:
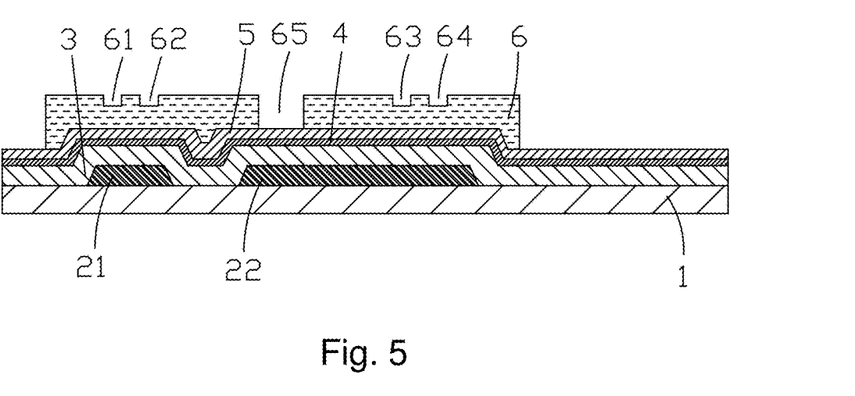
Figure 6:
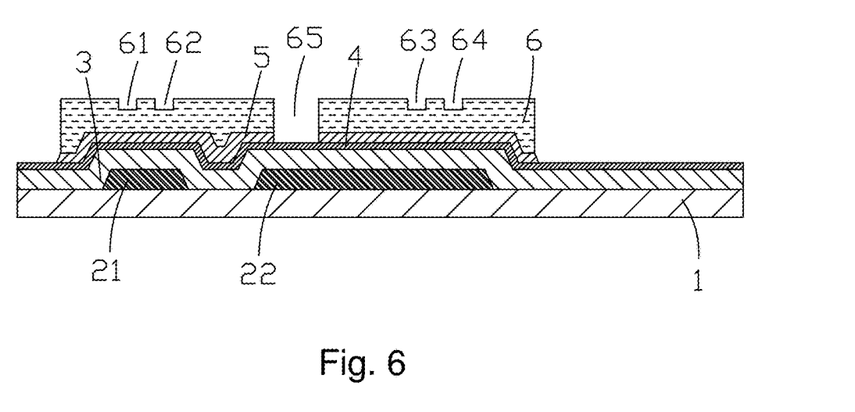
FIG. 6 is a schematic view illustrating step 32 of the method for manufacturing a TFT substrate according to the present invention.
Figure 7:
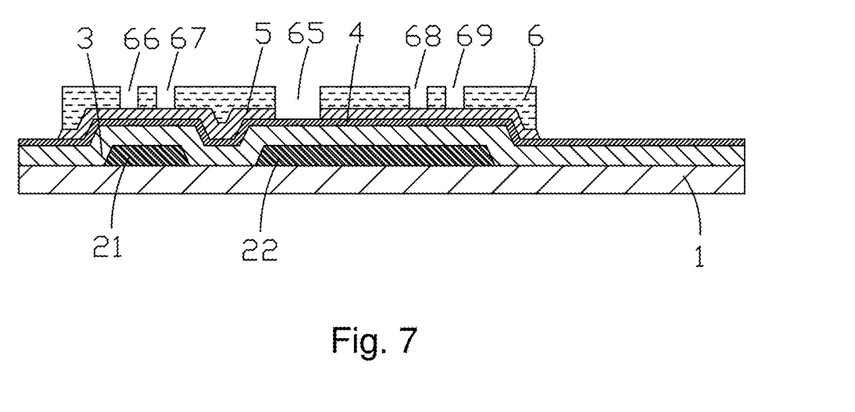
FIG. 7 is a schematic view illustrating step 33 of the method for manufacturing a TFT substrate according to the present invention.
Figure 8:
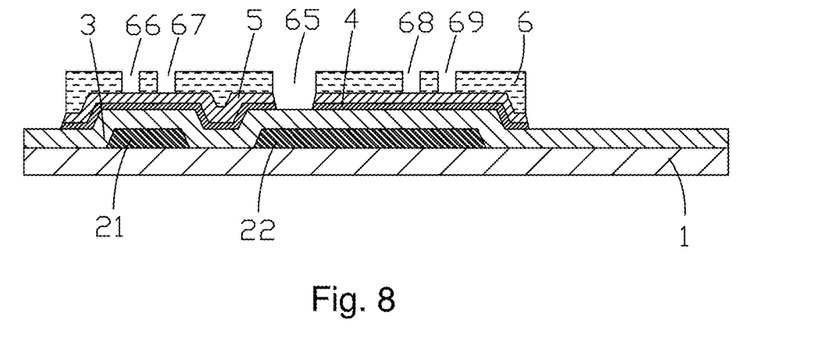
FIG. 8 is a schematic view illustrating step 34 of the method for manufacturing a TFT substrate according to the present invention.
Figure 9:
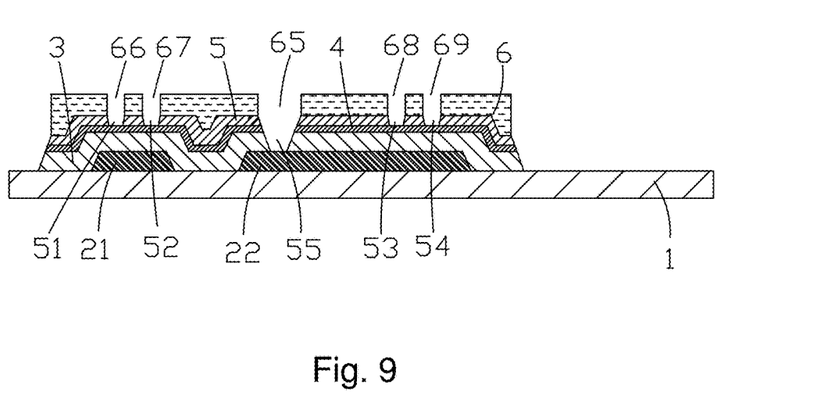
FIG. 9 is a schematic view illustrating step 35 of the method for manufacturing a TFT substrate according to the present invention.
Figure 10:
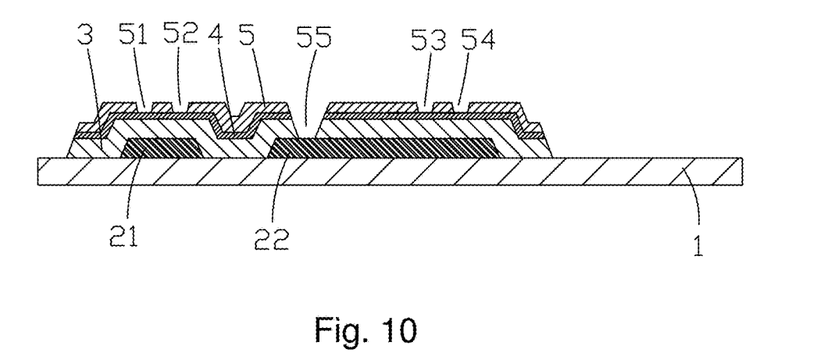
FIG. 10 is a schematic view illustrating step 36 of the method for manufacturing a TFT substrate according to the present invention.

Specifically, Step 3 comprises the following steps:

Step 31: as shown in FIGS. 4-5, depositing a photoresist layer 6 on the etch stop layer 5 and using a gray tone mask 10 to subject the photoresist layer 6 to exposure and development so as to completely etch off a portion of the photoresist layer 6 that corresponds to the non-TFT zone of the base plate 1 and to form, in the photoresist layer 6, a first trough 61 and a second trough 62 that are spaced from each other and corresponding to and located above the first gate electrode 21, a third trough 63 and a fourth trough 64 that are spaced from each other and corresponding to and located above the second gate electrode 22, and a first through hole 65 that corresponds to and is located above a side portion of the second gate electrode 22 that is adjacent to the first gate electrode 21;

Step 32: as shown in FIG. 6, using the photoresist layer 6 as a shielding layer to subject the etch stop layer 5 to etching by applying a first dry etch process so as to completely etch off a portion of the etch stop layer 5 that corresponds to the non-TFT zone of the base plate 1 and a portion of the etch stop layer 5 that corresponds to the first through hole 65 of the photoresist layer 6, wherein operation parameters of the first dry etch process are as follows:

where when the etch stop layer 5 and the gate insulation layer 3 are both formed of a material comprising silicon oxide, drying etching is conducted with a $CF_4$ (carbon tetrafluoride)+$O_2$ (oxygen gas) atmosphere, $CF_4$ flow rate being 0-5000 sccm, $O_2$ flow rate being 0-5000 sccm, etching time being 1-1000 s; and where when the etch stop layer 5 and the gate insulation layer 3 are both formed of a material comprising silicon nitride, drying etching is conducted with a $SF_6$ (sulfide hexafluoride)+$Cl_2$ (chlorine gas) atmosphere, $SF_6$ flow rate being 0-5000 sccm, $Cl_2$ flow rate being 0-5000 sccm, etching time being 1-1000 s;

Step 33: as shown in FIG. 7, applying an ashing process to subject the photoresist layer 6 to ashing treatment so as to reduce the overall thickness of the photoresist layer 6 in such a way that bottoms of the first trough 61, the second trough 62, the third trough 63, and the fourth trough 64 of the photoresist layer 6 are made completely through and respectively forming a second through hole 66, a third through hole 67, a fourth through hole 68, and a fifth through hole 69, wherein operation parameters of the ashing process are as follows: a $O_2$ atmosphere being used for ashing of the photoresist, $O_2$ flow rate being 0-5000 sccm, ashing time being 1-1000 s;

Step 34: as shown in FIG. 8, using the photoresist layer 6 as a shielding layer to subject the semiconductor layer 4 to etching by applying a wet etch process so as to completely etch off a portion of the semiconductor layer 4 that corresponds to the non-TFT zone of the base plate 1 and a portion of the semiconductor layer 4 that corresponds to the first through hole 65 of the photoresist layer 6, wherein operation parameter of the wet etch process are as follows: wet etching being conducted with $H_2C_2O_4$ (oxalic acid) solution, the $H_2C_2O_4$ solution having a concentration of 0.1%-50% mol/L, etching time being 1-1000 s;

Step 35: as shown in FIG. 9, using the photoresist layer 6 as a shielding layer to subject the etch stop layer 5 and the gate insulation layer 3 to etching by applying a second dry etch process so as to completely etch off portions of the etch stop layer 5 that correspond to the second through hole 66, the third through hole 67, the fourth through hole 68, and the fifth through hole 9 of the photoresist layer 6 to form, in the etch stop layer 5, the first contact hole 51 and the second contact hole 52 that are corresponding to and located above the first gate electrode 21 and the third contact hole 53 and the fourth contact hole 54 that are corresponding to and located above the second gate electrode 22, and, also, to completely etch off a portion of the gate insulation layer 3 that corresponds to the non-TFT zone of the base plate 1 and a portion of the gate insulation layer 3 that corresponds to the first through hole 65 of the photoresist layer 6 to form, in the etch stop layer 5, the semiconductor layer 4, and the gate insulation layer 3, the fifth contact hole 55 that corresponds to and is located above the side portion of the second gate electrode 22 that is adjacent to the first gate electrode 21, wherein operation parameters of the second dry etch process are as follows:

where when the etch stop layer 5 is formed of a material comprising silicon oxide, dry etching is conducted with a $CF_4$+$O_2$ atmosphere, $CF_4$ flow rate being 0-5000 sccm, $O_2$ flow rate being 0-5000 sccm, etching time being 1-1000 s, and where when the etch stop layer 5 is formed of a material comprising silicon nitride, dry etching is conducted with a $SF_6$+$Cl_2$ atmosphere, $SF_6$ flow rate being 0-5000 sccm, $Cl_2$ flow rate being 0-5000 sccm, etching time being 1-1000 s; and Step 36: as shown in FIG. 10, peeling off the photoresist layer 6.

Step 3 uses one gray tone mask to subject the gate insulation layer 3, the semiconductor layer 4, and the etch stop layer 5 to patterning by applying one photolithographic process so that the number of masks used in the manufacturing process of a TFT substrate can be reduced thereby simplifying the manufacturing process and increasing manufacturing efficiency and yield rate.

Figure 11:
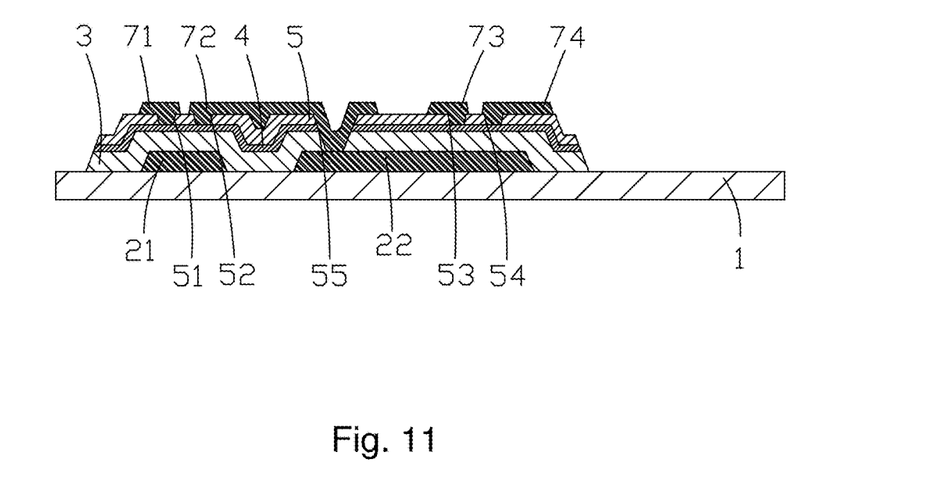
FIG. 11 is a schematic view illustrating step 4 of the method for manufacturing a TFT substrate according to the present invention.

Step 4: as shown in FIG. 11, depositing a second metal layer on the etch stop layer 5 and applying a third photolithographic process to pattern the second metal layer so as to form a first source electrode 71, a first drain electrode 72, a second source electrode 73, and a second drain electrode 74 that are spaced from each other, the first source electrode 71, the first drain electrode 72, the second source electrode 73, and the second drain electrode 74 being respectively connected through the first contact hole 51, the second contact hole 52, the third contact hole 53, the fourth contact hole 54 with the semiconductor layer 4, wherein the first gate electrode 21, the semiconductor layer 4, the first source electrode 71, and the first drain electrode 72 collectively constitute a first TFT; the second gate electrode 22, the semiconductor layer 4, the second source electrode 73, and the second drain electrode 74 collectively constitute a second TFT; and the first drain electrode 72 is connected through the fifth contact hole 55 with the second gate electrode 22 so as to have the first TFT and the second TFT connected in series.

Specifically, the first source electrode 71, the first drain electrode 72, the second source electrode 73, and the second drain electrode 74 are formed of a material comprising copper, aluminum, or molybdenum.

Figure 12:
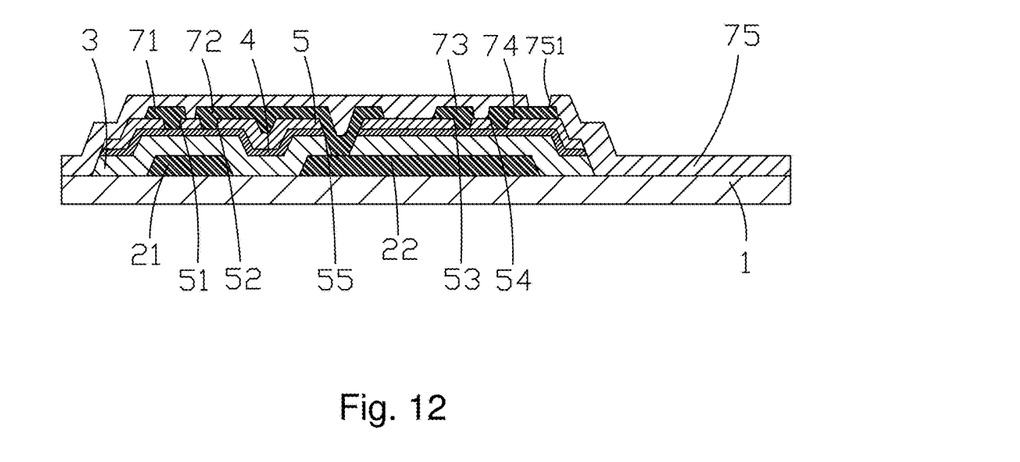
FIG. 12 is a schematic view illustrating step 5 of the method for manufacturing a TFT substrate according to the present invention.

Step 5: as shown in FIG. 12, depositing a passivation layer 75 on the first source electrode 71, the first drain electrode 72, the second source electrode 73, the second drain electrode 74, the etch stop layer 5, and the base plate 1 and applying a fourth photolithographic process to subject the passivation layer 75 to patterning so as to form a sixth through hole 751 in the passivation layer 75 to correspond to and be located above the second drain electrode 74.

Specifically, the passivation layer 75 is formed of a material comprising silicon nitride or silicon oxide.

Figure 13:
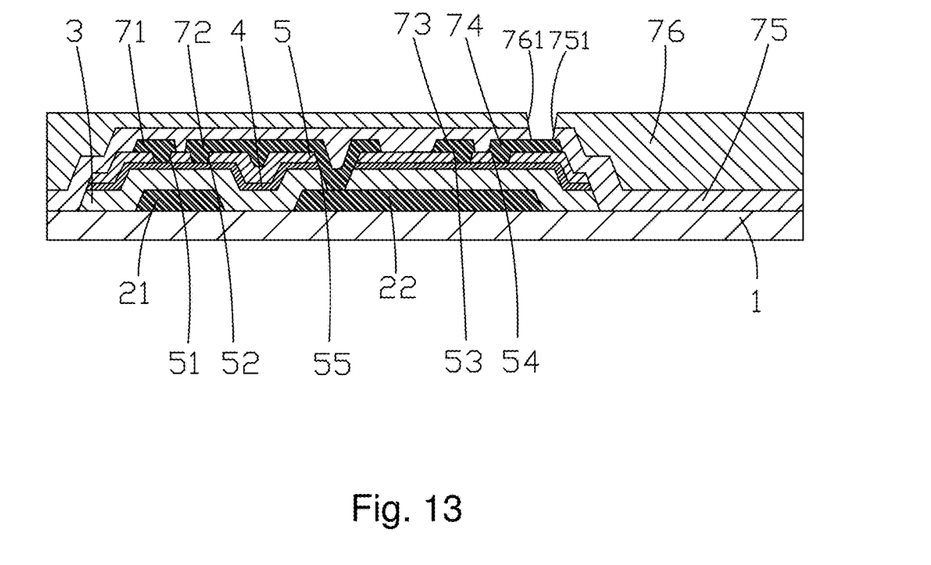
FIG. 13 is a schematic view illustrating step 6 of the method for manufacturing a TFT substrate according to the present invention.

Step 6: as shown in FIG. 13, depositing a planarization layer 76 on the passivation layer 75 and applying a fifth photolithographic process to subject the planarization layer 76 to patterning so as to form a seventh through hole 761 in the planarization layer 76 to correspond to the sixth through hole 75.

Specifically, the planarization layer 76 is formed of organic photoresist.

Figure 14:
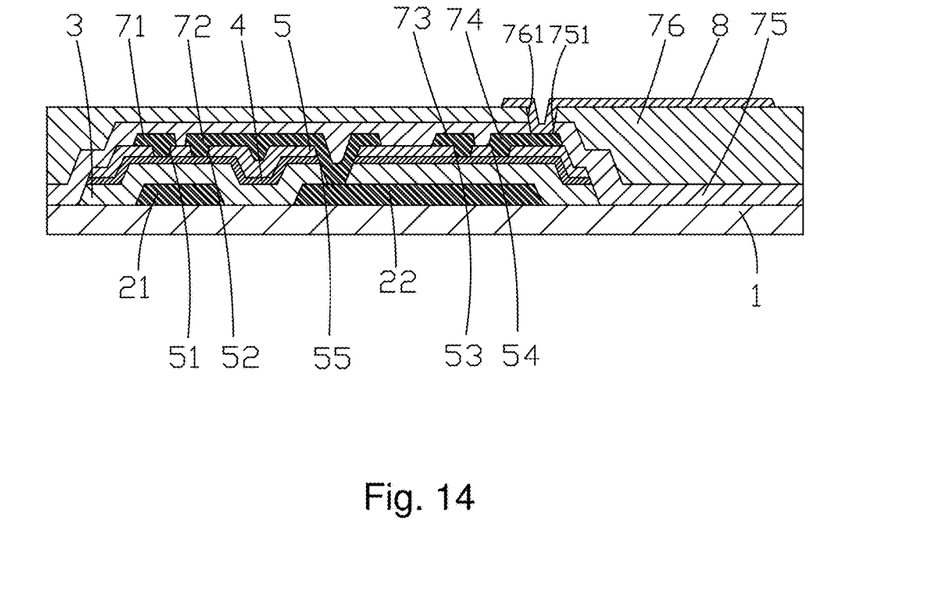
FIG. 14 is a schematic view illustrating step 7 of the method for manufacturing a TFT substrate according to the present invention.

Step 7: as shown in FIG. 14, depositing a pixel electrode layer 8 on the planarization layer 76 and applying a sixth photolithographic process to conduct patterning thereon, the pixel electrode layer 8 being connected through the sixth through hole 751 and the seventh through hole 761 with the second drain electrode 64.

Specifically, the pixel electrode layer 8 is formed of a material comprising ITO (indium tin oxide).

Figure 15:
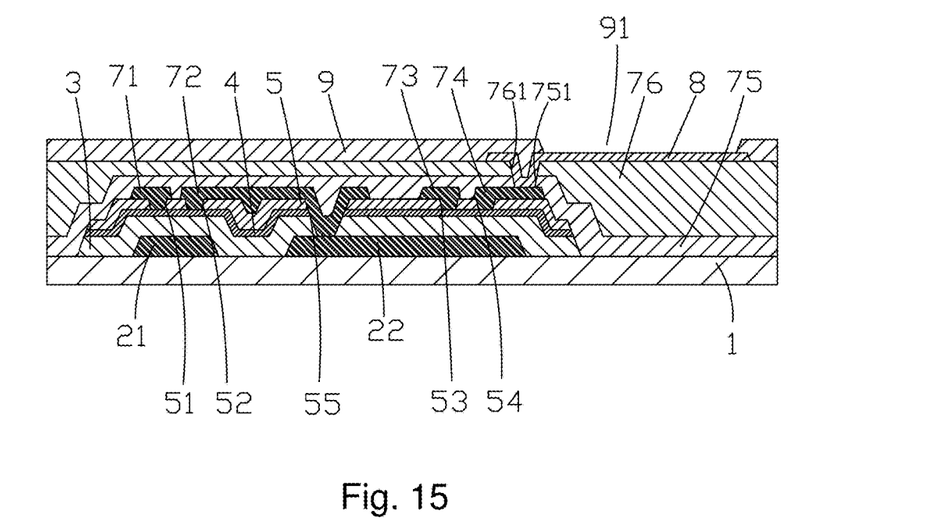
FIG. 15 is a schematic view illustrating step 8 of the method for manufacturing a TFT substrate according to the present invention.

Step 8: as shown in FIG. 15, depositing a pixel definition layer 9 on the pixel electrode layer 8 and the planarization layer 76 and applying a seventh photolithographic process to conduct patterning thereon so as to form an eighth through hole 91 in the pixel definition layer 9 to correspond to the pixel electrode layer 8 thereby exposing a portion of the pixel electrode layer 8.

Figure 16:
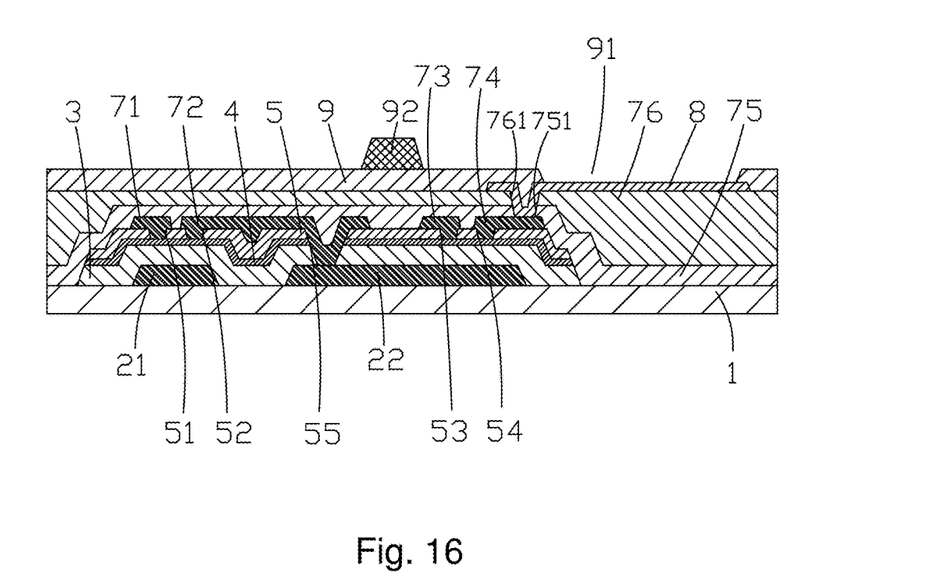
FIG. 16 is a schematic view illustrating step 9 of the method for manufacturing a TFT substrate according to the present invention and is also a cross-sectional illustrating a TFT substrate according to the present invention.

Step 9: as shown in FIG. 16, depositing an organic photoresist layer on the pixel definition layer 9 and applying an eighth photolithographic process to conduct patterning thereon so as to form a plurality of photo spacers 92 that is spaced from each other.

The above-described method for manufacturing a TFT substrate uses a gray tone mask to apply a single photolithographic process to simultaneously manufacture a gate insulation layer, a semiconductor layer, and a etch stop so as to reduce the number of the photolithographic processes used from ten processes to eight processes so as to simplifying the manufacturing process and effectively increasing the manufacturing efficiency and the yield rate.

Referring to FIGS. 16, the present invention also provides a TFT substrate structure, which comprises a base plate 1, a first gate electrode 21 and a second gate electrode 22 formed on the base plate 1 and spaced from each other, a gate insulation layer 3 formed on the first gate electrode 21, the second gate electrode 22, and the base plate 1, a semiconductor layer 4 formed on the gate insulation layer 3, an etch stop layer 5 formed on the semiconductor layer 4, a first source electrode 71, a first drain electrode 72, a second source electrode 73, and a second drain electrode 74 formed on the etch stop layer 5 and spaced from each other, a passivation layer 75 formed on the first source electrode 71, the first drain electrode 72, the second source electrode 73, and the second drain electrode 74 and covering the base plate 1, a planarization layer 76 formed on the passivation layer 75, a pixel electrode layer 8 formed on the planarization layer 76, a pixel definition layer 9 formed on the planarization layer 76 and the pixel electrode layer 8, and photo spacers 92 formed on the pixel definition layer 9.

The etch stop layer 5 comprises, formed therein, a first contact hole 51 and a second contact hole 52 corresponding to and located above the first gate electrode 21 and a third contact hole 53 a the fourth contact hole 54 corresponding to and located above the second gate electrode 22. The etch stop layer 5, the semiconductor layer 4, and the gate insulation layer 3 comprise a fifth contact hole 55 formed therein to correspond to and be located above a side portion of the second gate electrode 22 that is adjacent to the first gate electrode 21. The first contact hole 51, the second contact hole 52, the third contact hole 53, the fourth contact hole 54, and the fifth contact hole 55 are all through holes.

The first source electrode 71, the first drain electrode 72, the second source electrode 73, and the second drain electrode 74 are respectively connected through the first contact hole 51, the second contact hole 52, the third contact hole 53, the fourth contact hole 54 with the semiconductor layer 4. The first gate electrode 21, the semiconductor layer 4, the first source electrode 71, and the first drain electrode 72 collectively constitute a first TFT. The second gate electrode 22, the semiconductor layer 4, the second source electrode 73, and the second drain electrode 74 collectively constitute a second TFT. The first drain electrode 72 is connected through the fifth contact hole 55 with the second gate electrode 22 so as to have the first TFT and the second TFT connected in series.

The passivation layer 75 comprises a sixth through hole 751 formed therein to correspond to and be located above the second drain electrode 74. The planarization layer 76 comprises a seventh through hole 761 formed therein to correspond to the sixth through hole 751. The pixel electrode layer 8 is connected through the sixth through hole 751 and the seventh through hole 761 with the second drain electrode 74. The pixel definition layer 9 comprises an eighth through hole 91 formed therein to correspond to and be located above the pixel electrode layer 8. The eighth through hole 91 exposes a portion of the pixel electrode layer 8.

Specifically, the gate insulation layer 3, the semiconductor layer 4, and the etch stop layer 5 are formed with one photolithographic process.

Specifically, the first TFT is a switching TFT and the second TFT is a driving TFT.

Preferably, the base plate 1 comprises a glass board; the first gate electrode 21 and the second gate electrode 22 are each formed of a material comprising copper, aluminum, or molybdenum; and the gate insulation layer 3 is formed of a material comprising silicon oxide or silicon nitride.

Specifically, the semiconductor layer 4 is formed of a material comprising metal oxide and preferably, the metal oxide comprises IGZO (indium gallium zinc oxide) or IZO (indium zinc oxide).

The etch stop layer 5 is formed of a material comprising silicon oxide or silicon nitride.

Specifically, the first source electrode 71, the first drain electrode 72, the second source electrode 73, and the second drain electrode 74 are formed of a material comprising copper, aluminum, or molybdenum.

Specifically, the passivation layer 75 is formed of a material comprising silicon nitride or silicon oxide.

Specifically, the planarization layer 76 is formed of organic photoresist.

the pixel electrode layer 8 is formed of a material comprising ITO.

In the above-described TFT substrate structure, the gate insulation layer, the semiconductor layer, and the etch stop layer can be manufactured at the same time with one photolithographic process by using a gray tone mask so that the structure is simple and the manufacturing is easy to thereby effectively increase the manufacturing efficiency and yield rate.

In summary, the present invention provides a method for manufacturing a TFT substrate, which uses a gray tone mask to apply a single photolithographic process to simultaneously manufacture a gate insulation layer, a semiconductor layer, and a etch stop so as to reduce the number of the photolithographic processes used from ten processes to eight processes and reduce the number of masks used thereby simplifying the manufacturing process and effectively increasing the manufacturing efficiency and the yield rate. The present invention provides a TFT substrate structure, of which a gate insulation layer, a semiconductor layer, and an etch stop layer are manufactured at the same time with a photolithographic process by using a gray tone mask so that the structure is simple, the manufacturing is easy, and the manufacturing efficiency and yield rate are effectively increased.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A method for manufacturing a thin-film transistor (TFT) substrate, comprising the following steps:
   (1) providing a base plate, wherein the base plate is provided thereon with a TFT zone and a non-TFT zone, depositing a first metal layer on the base plate and applying a first photolithographic process to pattern the first metal layer so as to form a first gate electrode and a second gate electrode that are spaced from each other;
   (2) sequentially depositing a gate insulation layer, a semiconductor layer, and an etch stop layer on the first gate electrode, the second gate electrode, and the base plate;
   (3) applying a second photolithographic process to subject the gate insulation layer, the semiconductor layer, and the etch stop layer to patterning treatment so as to form, in the etch stop layer, a first contact hole and a second contact hole that correspond to and are located above the first gate electrode and a third contact hole and a fourth contact hole that correspond to and are located above the second gate electrode, and to form a fifth contact hole in the etch stop layer, the semiconductor layer, and the gate insulation layer to correspond to and be located above a side portion of the second gate electrode that is adjacent to the first gate electrode, wherein the first contact hole, the second contact hole, the third contact hole, the fourth contact hole, and the fifth contact hole are all through holes;
   (4) depositing a second metal layer on the etch stop layer and applying a third photolithographic process to pattern the second metal layer so as to form a first source electrode, a first drain electrode, a second source electrode, and a second drain electrode that are spaced from each other, the first source electrode, the first drain electrode, the second source electrode, and the second drain electrode being respectively connected through the first contact hole, the second contact hole, the third contact hole, the fourth contact hole with the semiconductor layer,
   wherein the first gate electrode, the semiconductor layer, the first source electrode, and the first drain electrode collectively constitute a first TFT; the second gate electrode, the semiconductor layer, the second source electrode, and the second drain electrode collectively constitute a second TFT; and the first drain electrode is connected through the fifth contact hole with the second gate electrode so as to have the first TFT and the second TFT connected in series;
   (5) depositing a passivation layer on the first source electrode, the first drain electrode, the second source electrode, the second drain electrode, the etch stop layer, and the base plate and applying a fourth photolithographic process to subject the passivation layer to patterning so as to form a sixth through hole in the passivation layer to correspond to and be located above the second drain electrode;
   (6) depositing a planarization layer on the passivation layer and applying a fifth photolithographic process to subject the planarization layer to patterning so as to form a seventh through hole in the planarization layer to correspond to the sixth through hole;
   (7) depositing a pixel electrode layer on the planarization layer and applying a sixth photolithographic process to conduct patterning thereon, the pixel electrode layer being connected through the sixth through hole and the seventh through hole with the second drain electrode;
   (8) depositing a pixel definition layer on the pixel electrode layer and the planarization layer and applying a seventh photolithographic process to conduct patterning thereon so as to form an eighth through hole in the pixel definition layer to correspond to the pixel electrode layer thereby exposing a portion of the pixel electrode layer; and
   (9) depositing an organic photoresist layer on the pixel definition layer and applying an eighth photolithographic process to conduct patterning thereon so as to form a plurality of photo spacers that is spaced from each other.

2. The method for manufacturing a TFT substrate as claimed in claim 1, wherein step (3) comprises the following steps:
   (31) depositing a photoresist layer on the etch stop layer and using a gray tone mask to subject the photoresist layer to exposure and development so as to completely etch off a portion of the photoresist layer that corresponds to the non-TFT zone of the base plate and to form, in the photoresist layer, a first trough and a second trough that are spaced from each other and corresponding to and located above the first gate electrode, a third trough and a fourth trough that are spaced from each other and corresponding to and located above the second gate electrode, and a first through hole that corresponds to and is located above a side portion of the second gate electrode that is adjacent to the first gate electrode;
   (32) using the photoresist layer as a shielding layer to subject the etch stop layer to etching by applying a first dry etch process so as to completely etch off a portion of the etch stop layer that corresponds to the non-TFT zone of the base plate and a portion of the etch stop layer that corresponds to the first through hole of the photoresist layer;
   (33) applying an ashing process to subject the photoresist layer to ashing treatment so as to reduce the overall thickness of the photoresist layer in such a way that bottoms of the first trough, the second trough, the third trough, and the fourth trough of the photoresist layer are made completely through and respectively forming a second through hole, a third through hole, a fourth through hole, and a fifth through hole;
   (34) using the photoresist layer as a shielding layer to subject the semiconductor layer to etching by applying a wet etch process so as to completely etch off a portion of the semiconductor layer that corresponds to the non-TFT zone of the base plate and a portion of the semiconductor layer that corresponds to the first through hole of the photoresist layer;
   (35) using the photoresist layer as a shielding layer to subject the etch stop layer and the gate insulation layer to etching by applying a second dry etch process so as to completely etch off portions of the etch stop layer that correspond to the second through hole, the third through hole, the fourth through hole, and the fifth through hole of the photoresist layer to form, in the etch stop layer, the first contact hole and the second contact hole that are corresponding to and located above the first gate electrode and the third contact hole and the fourth contact hole that are corresponding to and located above the second gate electrode,
   and, also, to completely etch off a portion of the gate insulation layer that corresponds to the non-TFT zone of the base plate and a portion of the gate insulation layer that corresponds to the first through hole of the photoresist layer to form, in the etch stop layer, the semiconductor layer, and the gate insulation layer, the fifth contact hole that corresponds to and is located above the side portion of the second gate electrode that is adjacent to the first gate electrode; and (36) peeling off the photoresist layer.

3. The method for manufacturing a TFT substrate as claimed in claim 2, wherein the gate insulation layer is formed of a material comprising silicon oxide or silicon nitride; the semiconductor layer is formed of a material comprising metal oxide; and the etch stop layer is formed of a material comprising silicon oxide or silicon nitride.

4. The method for manufacturing a TFT substrate as claimed in claim 3, wherein the first dry etch process of step (32) is conducted with the following operation parameters: wherein when the etch stop layer is formed of a material comprising silicon oxide, dry etching is conducted with a $CF_4+O_2$ atmosphere, $CF_4$ flow rate being 0-5000 sccm, $O_2$ flow rate being 0-5000 sccm, etching time being 1-1000 s; and when the etch stop layer is formed of a material comprising silicon nitride, dry etching is conducted with a $SF_6+Cl_2$ atmosphere, $SF_6$ flow rate being 0-5000 sccm, $Cl_2$ flow rate being 0-5000 sccm, etching time being 1-1000 s;

wherein the ashing process of step (33) is conducted with the following operation parameters: ashing of photoresist being conducted with an $O_2$ atmosphere, $O_2$ flow rate being 0-5000 sccm, ashing time being 1-1000 s;

wherein the wet etch process of step (34) is conducted with the following operation parameters: wet etching being conducted with $H_2C_2O_4$ solution, the $H_2C_2O_4$ solution having a concentration of 0.1%-50% mol/L, etching time being 1-1000 s;

wherein the second dry etch process of step (35) is conducted with the following operation parameters: wherein when the etch stop layer and the gate insulation layer are formed of materials comprising silicon oxide, dry etching is conducted with a $CF_4+O_2$ atmosphere, $CF_4$ flow rate being 0-5000 sccm, $O_2$ flow rate being 0-5000 sccm, etching time being 1-1000 s; and when the etch stop layer and the gate insulation layer are formed of materials comprising silicon nitride, dry etching is conducted with a $SF_6+Cl_2$ atmosphere, $SF_6$ flow rate being 0-5000 sccm, $Cl_2$ flow rate being 0-5000 sccm, etching time being 1-1000 s.

5. The method for manufacturing a TFT substrate as claimed in claim 1, wherein the base plate comprises a glass board; the first gate electrode and the second gate electrode are formed of a material comprising copper, aluminum, or molybdenum; and the first source electrode, the first drain electrode, the second source electrode, and the second drain electrode are formed of a material comprising copper, aluminum, or molybdenum.

* * * * *